(12) United States Patent
Yu et al.

(10) Patent No.: US 8,003,548 B2
(45) Date of Patent: Aug. 23, 2011

(54) ATOMIC LAYER DEPOSITION

(75) Inventors: Chen-Hua Yu, Hsinchu (TW); Liang-Gi Yao, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 12/793,346

(22) Filed: Jun. 3, 2010

(65) Prior Publication Data
US 2010/0279515 A1 Nov. 4, 2010

Related U.S. Application Data

(63) Continuation-in-part of application No. 11/808,388, filed on Jun. 8, 2007, now abandoned.

(51) Int. Cl.
*H01L 21/469* (2006.01)
*H01L 21/31* (2006.01)
(52) U.S. Cl. ............ 438/785; 257/E21.675; 438/216; 438/287; 438/591

(58) Field of Classification Search ........... 257/E21.675; 438/216, 287, 541, 785
See application file for complete search history.

(56) References Cited

U.S. PATENT DOCUMENTS

| | | | |
|---|---|---|---|
| 6,723,581 B1 | 4/2004 | Chabal et al. | |
| 6,764,927 B1 | 7/2004 | Yao et al. | |
| 6,818,517 B1 * | 11/2004 | Maes | 438/287 |

\* cited by examiner

*Primary Examiner* — Asok K Sarkar
(74) *Attorney, Agent, or Firm* — Birch, Stewart, Kolasch & Birch, LLP

(57) ABSTRACT

A method for forming an atomic deposition layer is provided, which includes: (a) performing a first water pulse on a substrate; (b) performing a precursor pulse on the hydroxylated substrate, wherein the precursor reacts with the hydroxyl groups and forms a layer; (c) purging the substrate with an inert carrier gas; (d) exposing the layer to a second water pulse for at least about 3 seconds so that the layer has a minimum of 70 percent of surface hydroxyl groups thereon; (e) purging the layer with the inert carrier gas; and (f) repeating steps (b) to (e) to form a resultant atomic deposition layer.

8 Claims, 6 Drawing Sheets

ATOMIC LAYER DEPOSITION

CROSS REFERENCE TO RELATED APPLICATIONS

This application is a Continuation-In-Part of application Ser. No. 11/808,388, filed on Jun. 8, 2007, the entirety of which is incorporated by reference herein.

BACKGROUND OF THE INVENTION

1. Field of the Invention

The invention relates to atomic layer deposition.

2. Description of the Related Art

Atomic layer deposition (ALD), for example, disclosed in U.S. Pat. No. 6,764,927, is a well known deposition technique in the semiconductor industry. ALD employs a precursor and a reactive gas to from an ALD layer on a substrate in a chamber.

The deposited ALD layer typically suffers from issues such as pinholes, or low density, leading to leakage current when applied in PMOS or NMOS transistors. U.S. Pat. No. 6,723,581 discloses forming a substantially-hydroxylated $SiO_xH_y$ layer (e.g. $3\times10^{14}$ hydroxyl per $cm^2$) by immersing a silicon substrate in a solution comprising de-ionized water and ozone to facilitate growth of the ALD layer. Then, an ALD layer is deposited on the substantially-hydroxylated surface by repeated cycles of ALD layer growth. Each cycle of the ALD layer growth consists of about 400 ms pulse of $H_2O$, about 200 ms pulse of $HfCl_4$ and several seconds pulse of $N_2$. However, the ALD layer thus formed still suffers from insufficient density.

Accordingly, a denser ALD layer capable of solving the described issues is desirable.

BRIEF SUMMARY OF INVENTION

Accordingly, a method for forming an atomic deposition layer, comprising: (a) performing a first water pulse on a substrate; (b) performing a precursor pulse on the hydroxylated substrate, wherein the precursor reacts with the hydroxyl groups and forms a layer; (c) purging the substrate with an inert carrier gas; (d) exposing the layer to a second water pulse for at least about 3 seconds so that the layer has a minimum of 70 percent of surface hydroxyl groups thereon; (e) purging the layer with the inert carrier gas; and (f) repeating steps (b) to (e) to form a resultant atomic deposition layer.

Furthermore, the present invention also provides a method for forming a gate dielectric layer with reduced leakage current, comprising: (a) providing a silicon substrate; (b) performing a first water pulse on the silicon substrate for at least 3 seconds to create a minimum of 70 percent of surface hydroxyl groups thereon; (c) performing a precursor pulse on the hydroxylated silicon substrate, wherein the precursor reacts with the hydroxyl groups and forms a layer; (d) purging the silicon substrate with an inert carrier gas; (e) exposing the layer to a second water pulse for at least 3 seconds so that the layer has a minimum of 70 percent of surface hydroxyl groups thereon; (f) purging the layer with the inert carrier gas; and (g) repeating steps (c) to (f) until the gate dielectric layer is formed on the silicon substrate.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF INVENTION

The following description is of the best-contemplated mode of carrying out the invention. This description is made for the purpose of illustrating the general principles of the invention and should not be taken in a limiting sense. For example, the formation of a first feature over, above, below, or on a second feature in the description that follows may include embodiments in which the first and second features are formed in direct contact, and may also include embodiments in which additional features may be formed between the first and second features, such that the first and second features may not be in direct contact. The scope of the invention is best determined by reference to the appended claims.

Embodiments according to the present invention disclose a method for forming an ALD layer that may provide an adequate high density for applicable for NMOS or PMOS transistors.

Figure 1:
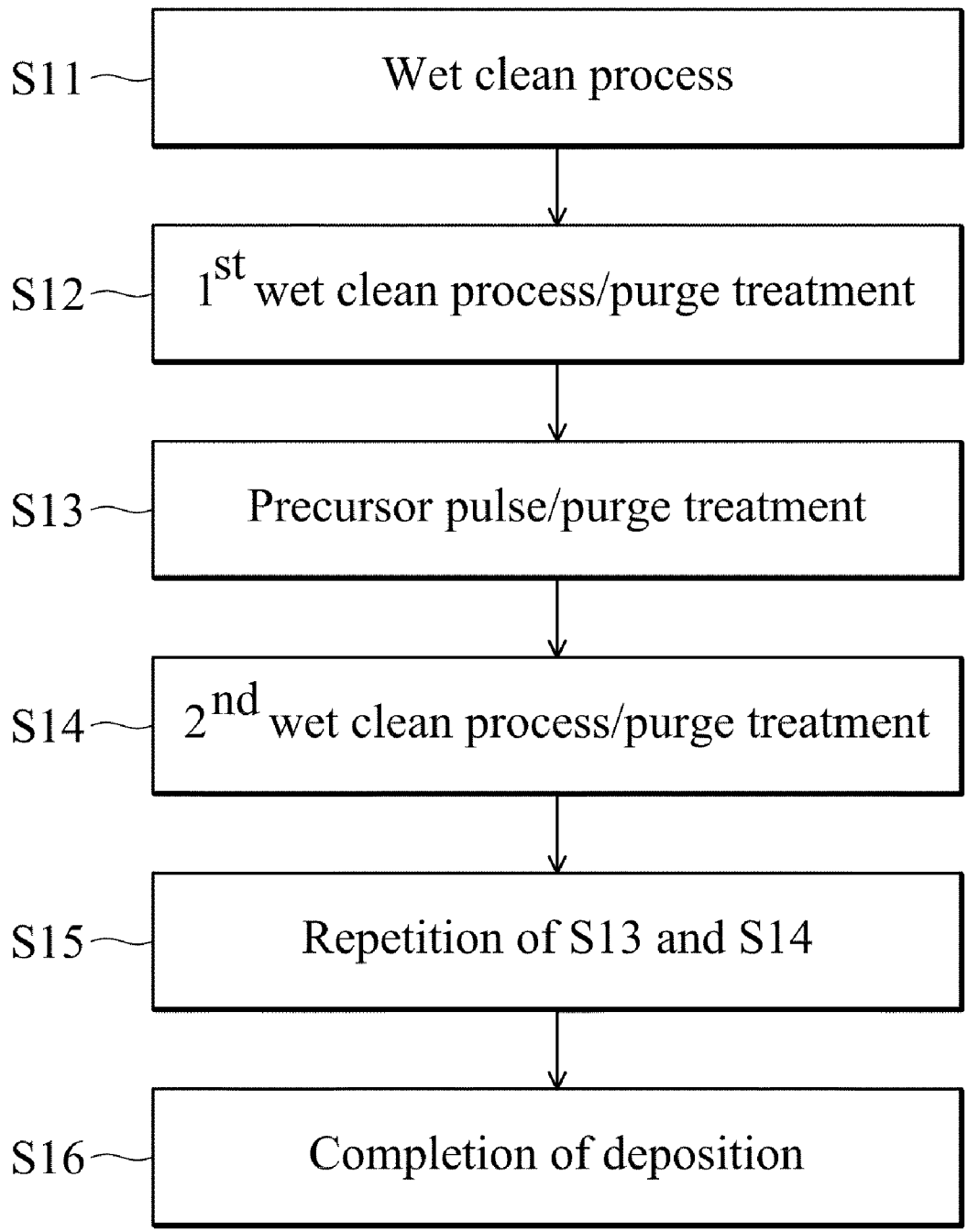
FIG. 1 shows a flowchart illustrating an ALD method according to embodiments of the present disclosure.

FIG. 1 shows a flowchart of atomic layer deposition for one embodiment according to the present invention.

As shown in FIG. 1, in step S11, a semiconductor substrate such as a silicon substrate is loaded into a reaction chamber and subjected to a wet cleaning process. The wet cleaning process may use a standard clean 1 (SC1) solution ($NH_4OH/H_2O_2/H_2O$), standard clean 2 (SC2) solution ($HCl/H_2O_2/H_2O$) and HF solution sequentially, or use a standard clean 1 (SC1) solution ($NH_4OH/H_2O_2/H_2O$), standard clean 2 (SC2) solution ($HCl/H_2O_2/H_2O$) and HF vapor sequentially, or use an HF vapor, standard clean 1 (SC1) solution ($NH_4OH/H_2O_2/H_2O$) and standard clean 2 (SC2) solution ($HCl/H_2O_2/H_2O$) sequentially, or use an HF solution, standard clean 1 (SC1) solution ($NH_4OH/H_2O_2/H_2O$) and standard clean 2 (SC2) solution ($HCl/H_2O_2/H_2O$) sequentially, or use other dilute ozone solutions such as a de-ionized water/ozone solution as disclosed in U.S. Pat. No. 6,723,581.

As shown in FIG. 1, in step S12, a first water pulse/purge hydroxylation treatment may be preformed. In this hydroxylation treatment, the first water pulse comprises a water pulse of at least about 3 seconds. In some embodiments, the duration of the first water pulse may be between about 3 and 50 seconds, and preferably between 5 and 20 seconds. Alternatively, the first water pulse may consist of multiple pulses as long as the total pulse period is at least about 3 seconds. For example, the first water pulse may comprise six water pulses or more, and each pulse has a time period of about 0.5 seconds. The first water pulse may comprise a saturated water vapor. Compared to the conventional ALD process using a water pulse of about 0.5 seconds or less, the longer water pulse may result in the silicon substrate having a minimum of 70% of surface hydroxyl groups thereon. After the hydroxylation treatment, a purge gas such as nitrogen or other inert gas may be introduced for about 1 to 5 seconds to discharge the residual water vapor.

As shown in FIG. 1, in step S13, a precursor pulse may be introduced to the reaction chamber to react with the hydroxylated silicon substrate. The introduced precursor, such as a metal halide comprising a halide of Li, Be, Mg, Ca, Sr, Sc, Y, Zr, Hf, Al, La, Ce, Pr, Nd, Sm, Eu, Gd, Tb, Dy, Ho, Er, Tm, Yb, Lu or combinations thereof, may react with the hydroxyl groups (—OH) over the substantially hydroxylated silicon substrate, to form a first chemi-sorption layer which contains chlorine atoms thereon. To complete the reaction, the duration for which a sufficient number of precursors are provided is extended. Subsequent to completion of the reaction, a purge gas such as nitrogen or other inert gas may be introduced for about 1 to 5 seconds to purge the residual unreacted precursor.

As shown in FIG. 1, in step S14, a second water pulse/purge treatment is introduced into the reaction chamber after the residual precursor is purged. Similar with the first water pulse, the second water pulse also comprises a longer water pulse of at least about 3 seconds. In some embodiments, the second water pulse is between about 3 and 50 seconds, or preferably between about 5 and 20 seconds. The second water pulse may also consist of multiple water pulses as long as the total water pulse period is at least 3 seconds. It should be noted that the duration of the first and the second water pulse may be the same or different with the first water pulse. For example, each of the first water pulse and the second water pulse may have a time period of about 3 seconds. In some embodiments, the second water pulse may be at least 2 seconds longer than the first water pulse. For example, the first water pulse may have a time period of about 3 seconds, but the second water pulse may have a time period of about 5 seconds. The second water pulse is introduced onto the first chemi-sorption layer. The functional groups of the precursor such as chlorine atoms over the first chemi-sorption layer can be replaced with OH groups. The second water pulse may also comprise a saturated water vapor. After hydroxylation of the first chemisorption layer, a purge gas such as nitrogen or other inert gas is introduced for about 1 to 5 seconds to purge the residual water vapor and the side products. Thus, a first sublayer of an ALD layer (e.g. an oxide of Li, Be, Mg, Ca, Sr, Sc, Y, Zr, Hf, Al, La, Ce, Pr, Nd, Sm, Eu, Gd, Tb, Dy, Ho, Er, Tm, Yb, Lu or combinations thereof) is formed. In the present embodiment, the second water pulse may also provide the first sublayer with a minimum of 70% of surface hydroxyl groups (—OH) due to the sufficiently long pulse period.

Then, as shown in FIG. 1, a S15 step would repeat steps S13 and S14 with certain cycles, at least 5 cycles or more, for a desired thickness requested by a high-k gate dielectric layer.

Finally, a resultant ALD layer of a desired thickness is formed (step S16). It should be noted that one of ordinary skill in the art would recognize that the thickness of the resultant ALD layer is not limited to the disclosed embodiments. To the contrary, it may be varied depending on the particular requirements when being applied. According to an important feature of the present invention, since the surface coverage of the hydroxyl groups over each sublayer of the ALD layer is greater than 70% (i.e. a hydroxyl-rich surface), the precursor introduced in steps S13 and S15 can more sufficiently react with the hydroxyl groups over the chemi-sorption layers. Thus, the resultant ALD layer may provide a denser ALD layer which may be applied in NMOS or PMOS transistors, and eliminate issues such as leakage current. Further, the resultant ALD layer can also have a flat surface morphology compared to the conventional ALD layer formed by the shorter (e.g. 0.5 seconds or less) water pulse.

The resultant ALD layer such as an $HfO_2$ layer may be used as a high-k gate dielectric layer for PMOS or NMOS transistors. Also, an interfacial layer may be formed between the high-k gate dielectric layer and the substrate to reduce the stress induced from lattice mismatch or large thermal expansion coefficient differences between the high-k gate dielectric layer and the substrate. The interfacial layer preferably may be formed of silicon oxide or silicon nitride. The interfacial layer may be formed by rapid thermal oxidation process. Alternatively, the interfacial layer may also be formed by the ALD methods known in the art. In this case, the first water pulse in step S12 of the ALD method according to the present invention would be applied on the interfacial layer to create a sufficiently number of hydroxyl groups over the interfacial layer, e g a minimum of 70% of surface coverage. Therefore, a denser ALD layer may also be provided on the interfacial layer.

EXAMPLES $HfO_2$ layers were formed according to the ALD methods discussed above with various water pulse durations and cycles as listed in Table 1. Herein, both of the first and the second water pulses were introduced for the same duration. $HfCl_4$ was used as the precursor to form an $HfO_2$ layer. $N_2$ was introduced after each water and precursor pulse for 3 seconds to purge the residual unreacted gases or side products. Thicknesses and leakage currents were measured and are summarized in Table 1 and FIG. 2. The results showed that the $HfO_2$ layers made by using 5 seconds water pulse (Examples 1-2) were 1.1 to 1.3 times thicker than that of the $HfO_2$ layers made by using 0.5 seconds water pulse (Comparative Examples 1-2).

TABLE 1

| Sample No. | Time period of water pulse | Cycles | Thickness (Å) |
| --- | --- | --- | --- |
| Comparative Example 1 | 0.5 s | 30 | 15.5 |
| Example 1 | 5 s | 30 | 18 |
| Comparative Example 2 | 0.5 s | 40 | 19.8 |
| Example 2 | 5 s | 40 | 24 |

Figure 2:
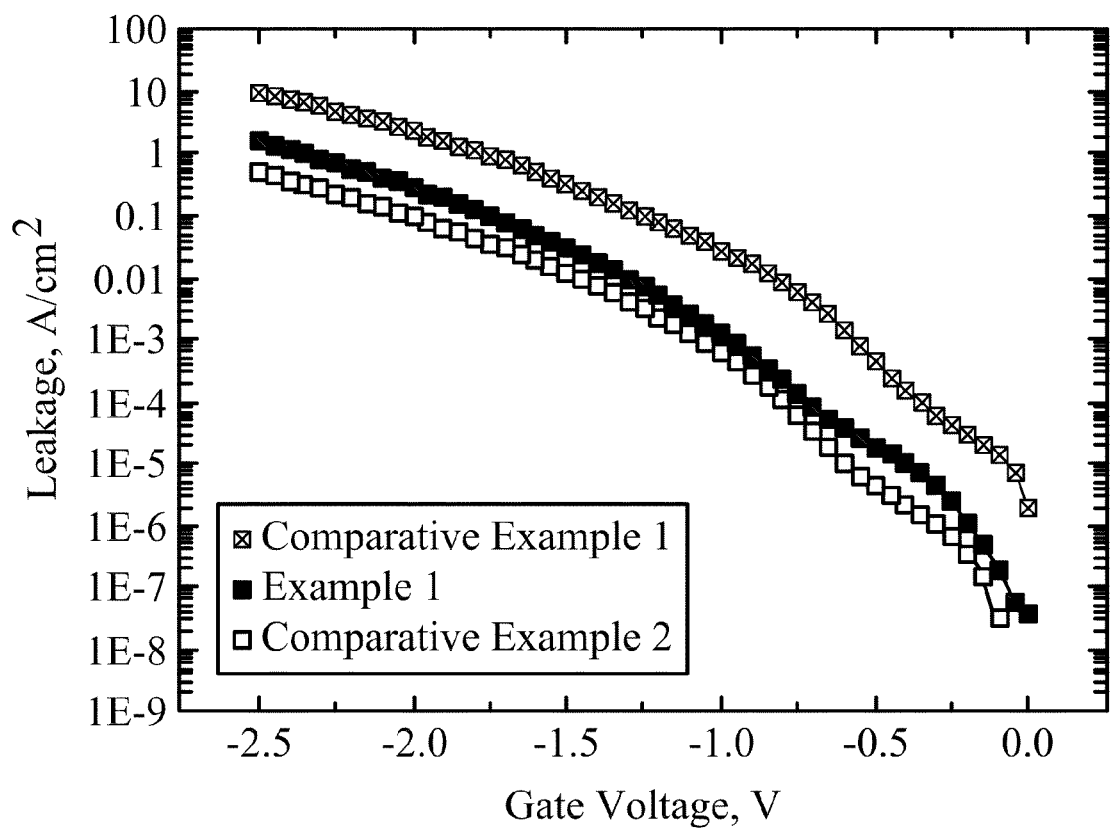
FIG. 2 is a schematic view illustrating leakage current of resultant ALD layers according to embodiments of the present disclosure.

In FIG. 2, the leakage currents of the above resultant $HfO_2$ layers were measured. It was found that, with the same ALD cycles, Example 1 exhibited significantly reduced leakage current compared to Comparative Example 1. The leakage current of Example 1 was also close to that of Comparative Example 2 which was around 2 Å thicker due to the performance of 10 more ALD cycles. This result means that a denser $HfO_2$ layer that reduces leakage current was obtained by using the longer water pulse. In other words, a thinner EOT can be obtained by using the longer water pulse due to less leakage issue in thin $HfO_2$ film less than 25 A. And it was proven in capacitance-voltage (CV) measurement for devices, thinner oxide thickness at inversion state of Example 2 (16.5 Å) was obtained, compared to that of Comparative Example 2 (17.6 Å), under a gate voltage of about 1.7 V.

Figure 3A:
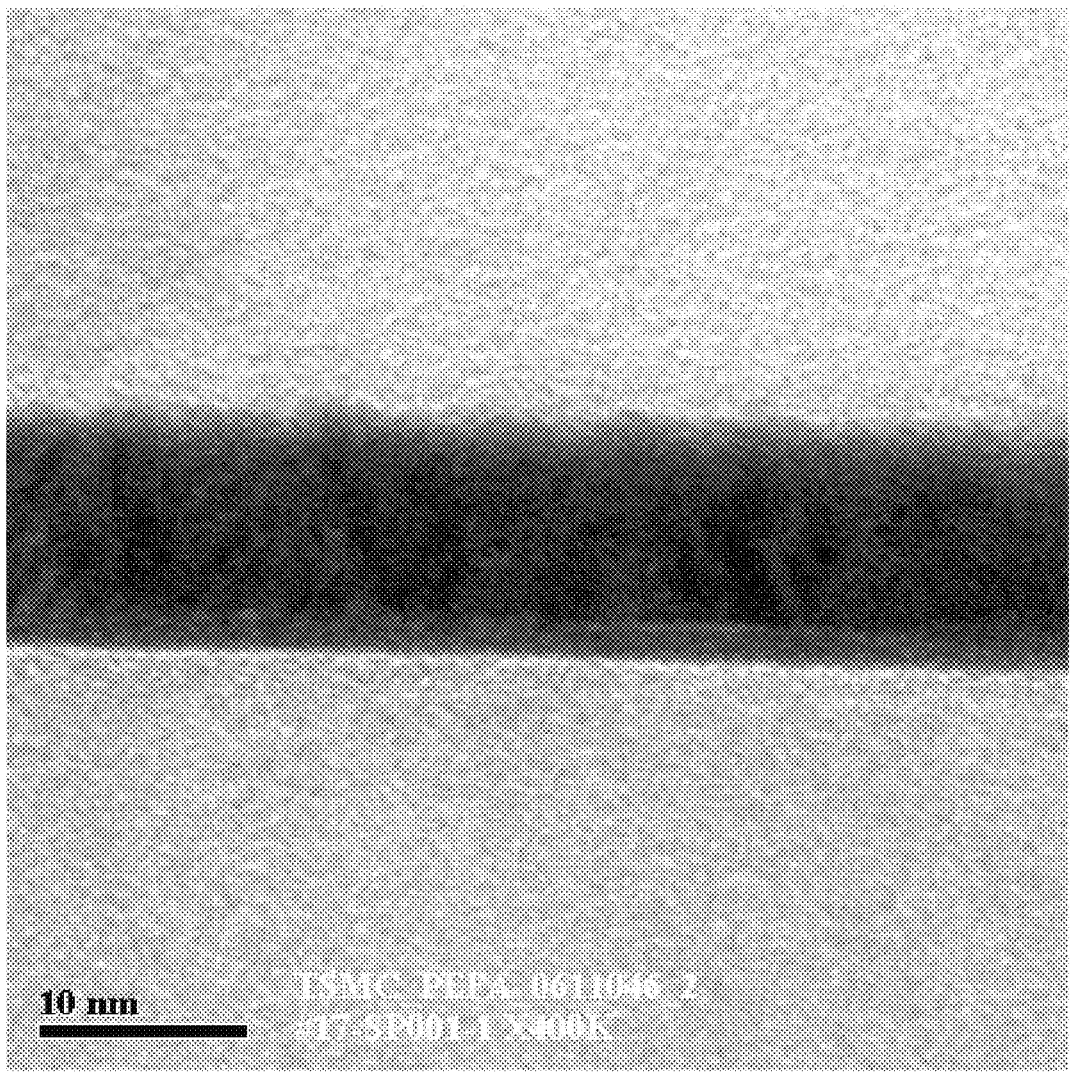
FIGS. 3A and 3B show transmission electron microscopy (TEM) figures of the resultant $HfO_2$ layer using 5 seconds and 0.5 seconds of water pulses after post annealing, respectively.
Figure 3B:
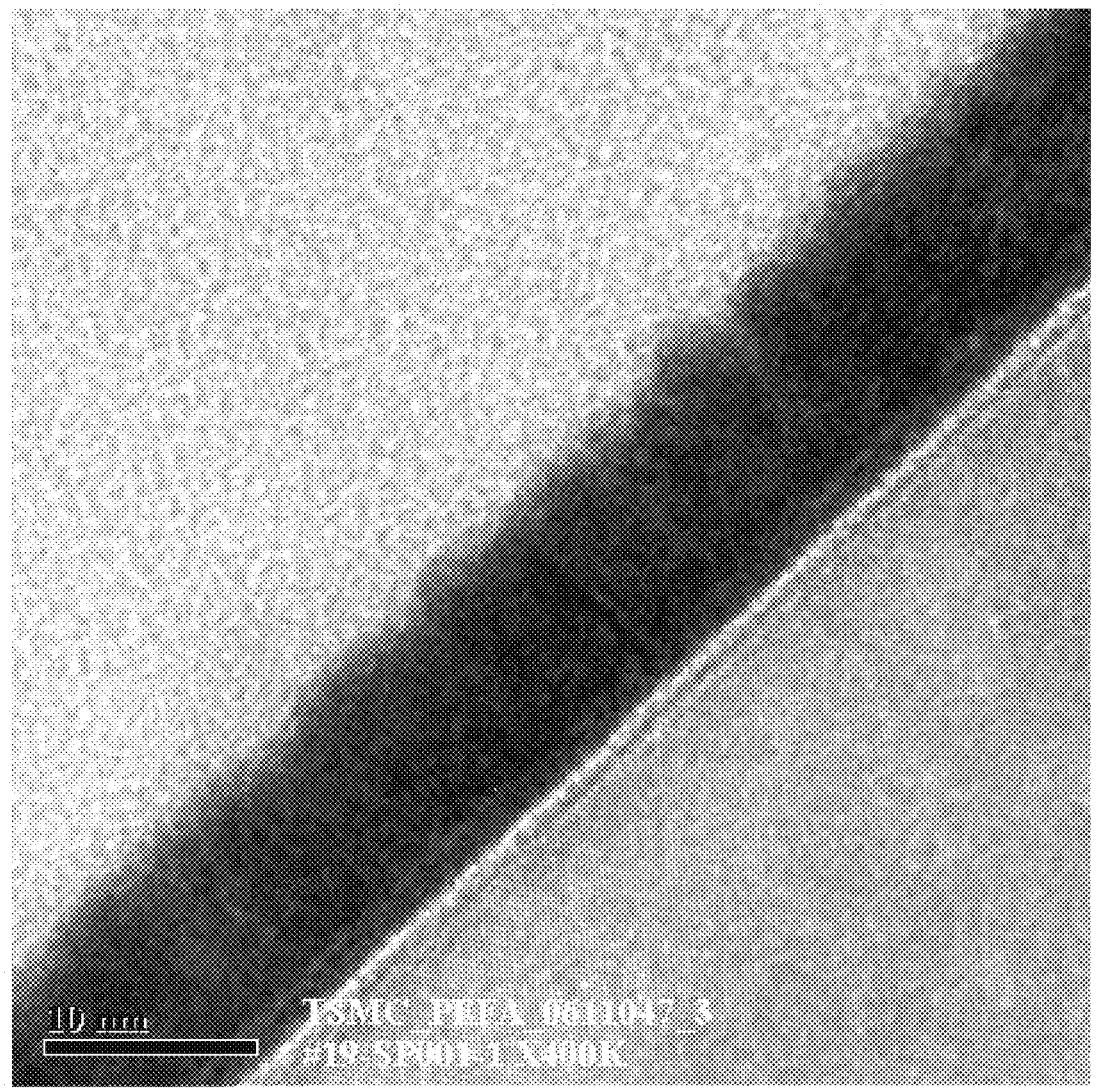
Figure 4A:
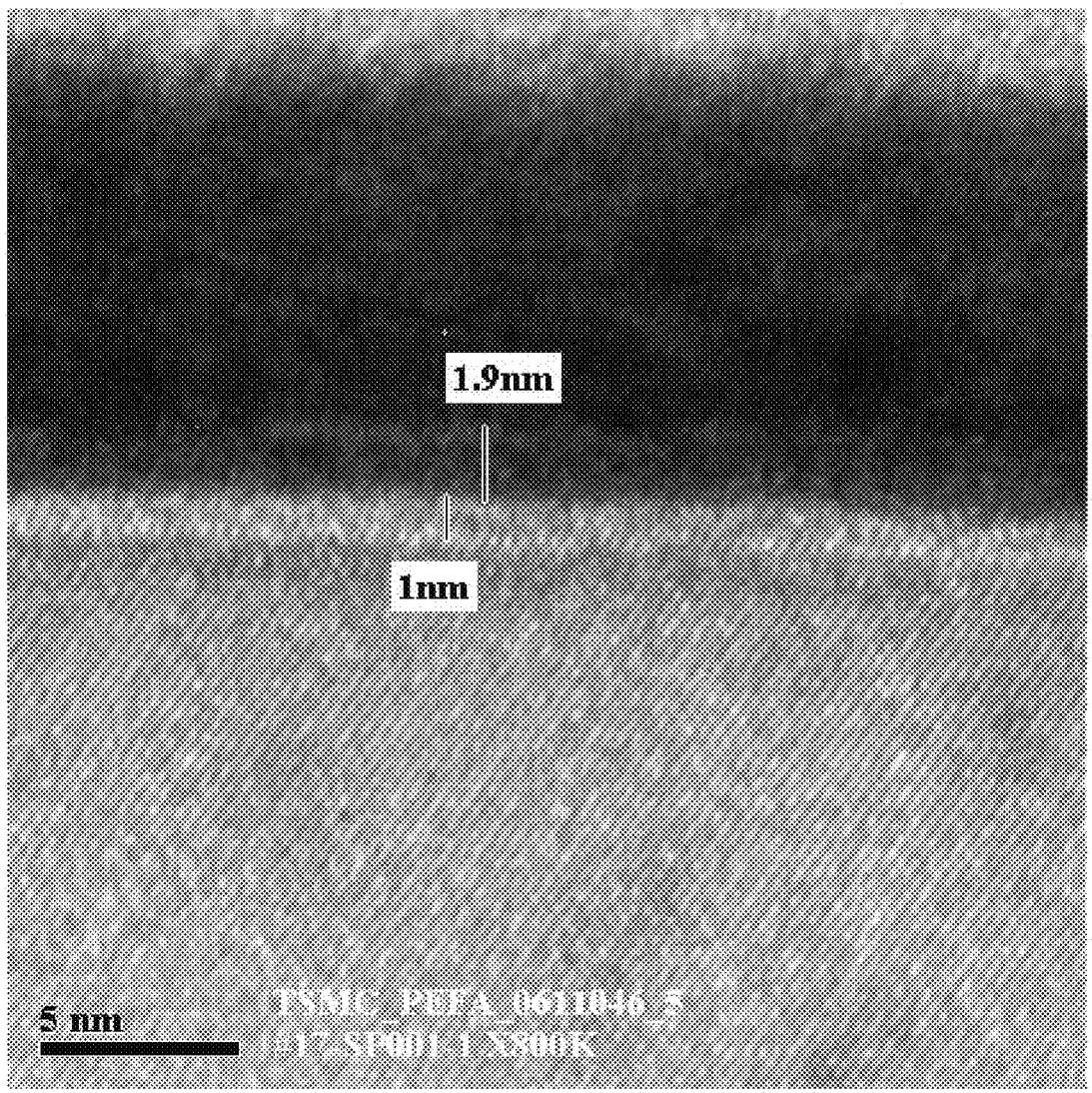
FIGS. 4A and 4B show high resolution transmission electron microscopy (TEM) figures of the resultant $HfO_2$ layer using 5 seconds and 0.5 seconds of water pulses after post annealing, respectively.
Figure 4B:
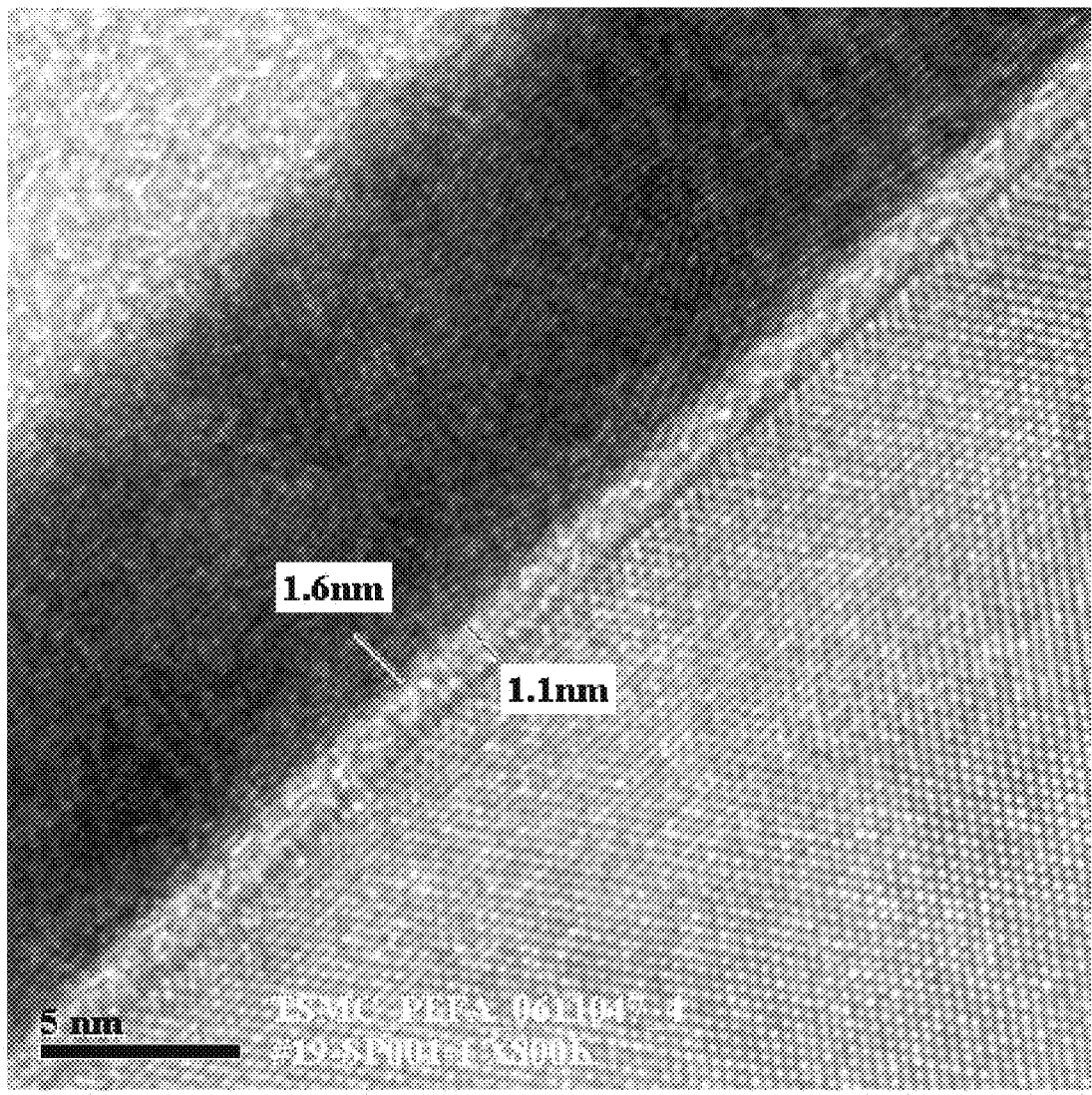

FIGS. 3A and 3B show transmission electron microscopy (TEM) pictures of the samples of Example 1 and Comparative Example 1 after post annealing, respectively. By comparing FIGS. 3A and 3B, it can be found that the longer water pulses results in a smother surface. It is believed that the smother surface was due to the denser deposition for each ALD cycle with sufficiently longer water pulses. FIGS. 4A and 4B also show high resolution transmission electron microscopy (TEM) pictures of the samples of Example 1 and Comparative Example 1 after post annealing, respectively.

Referring to FIGS. 4A and 4B, it can be found that a thinner interfacial oxide layer of 1 nm and a thicker $HfO_2$ layer of 1.9 nm were obtained by the sample of Example 1, compared to the sample of Comparative Example 1 which resulted in an interfacial oxide of 1.1 nm and a $HfO_2$ layer of 1.6 nm The thinner interfacial oxide and the thicker $HfO_2$ layer shown in the TEM pictures explained that the thinner gate oxide thickness at inversion state (Tox_inv) and reduced leakage current can be obtained by using the longer water pulse.

In summary, the present invention provides a novel method for forming ALD layer, wherein a sufficiently long duration of water pulses, such as at least 3 seconds, is provided to fully replace the functional groups of the precursors (e.g. Cl group of $HfCl_4$) with OH groups. Thus, the precursor introduced in next ALD cycle would be reacted with the OH groups more completely, and a denser resultant ALD layer can be obtained. The resultant ALD layer may be provided with an adequate density so that leakage current is minimized and have a smaller physical thickness. Therefore, the resultant ALD layer can be advantageously applied as a gate dielectric layer for PMOS and NMOS transistors.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for forming a gate dielectric layer with reduced leakage current, comprising:
   (a) providing a silicon substrate;
   (b) performing a first water pulse on the silicon substrate for at least 3 seconds to create a minimum of 70 percent of surface hydroxyl groups thereon;
   (c) performing a precursor pulse on the hydroxylated silicon substrate, wherein the precursor reacts with the hydroxyl groups and forms a layer;
   (d) purging the silicon substrate with an inert carrier gas;
   (e) exposing the layer to a second water pulse for at least 3 seconds so that the layer has a minimum of 70 percent of surface hydroxyl groups thereon;
   (f) purging the layer with the inert carrier gas; and
   (g) repeating steps (c) to (f) until the gate dielectric layer is formed on the silicon substrate.

2. The method as claimed in claim 1, wherein each of the first and the second water pulse, independently, has a time period of about 5 seconds.

3. The method as claimed in claim 1, wherein each of the first and the second water pulse, independently, comprises single or multiple pulses.

4. The atomic layer deposition as claimed in claim 1, wherein the water pulse comprises a saturated water vapor.

5. The method as claimed in claim 1, wherein each of the first and the second water pulse, independently, has a time period between of about 3 seconds and 50 seconds.

6. The method as claimed in claim 1, wherein the metal precursor is HfC14, and the gate dielectric layer comprises an oxide of Li, Be, Mg, Ca, Sr, Sc, Y, Zr, Hf, Al, La, Ce, Pr, Nd, Sm, Eu, Gd, Tb, Dy, Ho, Er, Tm, Yb, Lu or combinations thereof.

7. The method as claimed in claim 1, wherein steps (b) to (e) comprise a cycle that is repeated 5 times or more.

8. The method as claimed in claim 1, wherein the inert carrier gas comprises nitrogen.

* * * * *